United States Patent
Dawley et al.

(10) Patent No.: US 10,184,963 B2
(45) Date of Patent: Jan. 22, 2019

(54) POWER QUALITY DIAGNOSIS FOR POWER CONDITIONING

(71) Applicant: Electronic Systems Protection, Inc., Knightdale, NC (US)

(72) Inventors: Robert A. Dawley, Clayton, NC (US); Richard J. Billingsley, Rossland (CA)

(73) Assignee: Electronic Systems Protection, Inc., Knightdale, NC (US)

( * ) Notice: Subject to any disclaimer, the term of this patent is extended or adjusted under 35 U.S.C. 154(b) by 739 days.

(21) Appl. No.: 13/929,288

(22) Filed: Jun. 27, 2013

(65) Prior Publication Data

US 2014/0005963 A1 Jan. 2, 2014

Related U.S. Application Data

(60) Provisional application No. 61/665,473, filed on Jun. 28, 2012.

(51) Int. Cl.
| | |
|---|---|
| *G01R 21/00* | (2006.01) |
| *G01R 19/25* | (2006.01) |
| *H02H 3/06* | (2006.01) |
| *H02H 3/10* | (2006.01) |
| *H02H 3/20* | (2006.01) |
| *H02H 5/04* | (2006.01) |

(52) U.S. Cl.
CPC .......... *G01R 21/00* (2013.01); *G01R 19/2513* (2013.01); *G01R 19/2506* (2013.01); *H02H 3/06* (2013.01); *H02H 3/10* (2013.01); *H02H 3/207* (2013.01); *H02H 5/041* (2013.01)

(58) Field of Classification Search
CPC ............... G01R 21/00; G01R 19/2506; G01R 19/2513; H02H 3/06
USPC ................................. 702/60, 57, 58, 59, 61
See application file for complete search history.

(56) References Cited

U.S. PATENT DOCUMENTS

| | | | |
|---|---|---|---|
| 2005/0018371 A1* | 1/2005 | Mladenik | ............... H02H 3/00 361/78 |
| 2005/0222784 A1 | 10/2005 | Tuff | |
| 2005/0273281 A1* | 12/2005 | Wall | ............... G01D 4/004 702/60 |

(Continued)

FOREIGN PATENT DOCUMENTS

WO 2011067988 A1 6/2011

OTHER PUBLICATIONS

European Search Report in corresponding European Patent Application No. 13003293.1, dated Sep. 2, 2015.

*Primary Examiner* — Eman Alkafawi
(74) *Attorney, Agent, or Firm* — Edell, Shapiro & Finnan, LLC

(57) ABSTRACT

A power monitor includes a power conditioning circuit that provides conditioned power to a load. The power conditioning circuit includes at least one sensor to measure a power quality characteristic, e.g., input voltage, load current, temperature, etc. A terminal device implements a diagnostic tool for the power monitor and includes a processor to obtain data indicative of the power quality characteristic over a communication link with the power monitor. The data may be retrieved in response to a trigger condition. A user interface implemented on the terminal device displays the obtained power quality characteristic as at least one temporally varying waveform.

18 Claims, 6 Drawing Sheets

(56) References Cited

U.S. PATENT DOCUMENTS

| | | | |
|---|---|---|---|
| 2008/0019068 A1* | 1/2008 | Reynolds | G06F 1/26 361/93.1 |
| 2009/0076748 A1 | 3/2009 | Robertson | |
| 2009/0293062 A1* | 11/2009 | Amir | G06F 9/485 718/104 |
| 2012/0194955 A1 | 8/2012 | Billingsley et al. | |
| 2013/0049466 A1* | 2/2013 | Adams | G06F 1/266 307/39 |
| 2013/0158907 A1* | 6/2013 | Guo | G01R 21/133 702/60 |
| 2014/0001977 A1* | 1/2014 | Zacharchuk | H04L 12/2816 315/291 |

\* cited by examiner

POWER QUALITY DIAGNOSIS FOR POWER CONDITIONING

RELATED APPLICATION DATA

This application claims priority under 35 U.S.C. § 119(e) from U.S. Provisional Patent Application No. 61/665,473 entitled "XGII Oscilloscope Feature," filed Jun. 28, 2012. The disclosure of this provisional patent application is incorporated herein by reference in its entirety.

TECHNICAL FIELD

The present disclosure relates to diagnosing power related problems through the use of diagnostic tools incorporated into power conditioning equipment.

BACKGROUND

Power conditioners typically condition alternating current (AC) power from a power source prior to delivering the conditioned power to a load. Such conditioning may include noise filtration and transient voltage surge suppression, among other things. Certain power conditioner circuits incorporate various sensors to monitor power quality and/or power consumption and, in certain cases, take a specific action when the power quality fails to meet specified criteria. While power conditioners are intended to protect and improve the performance of connected equipment, power related issues can still occur, particularly when stringent power quality criteria are to be met across multiple system variables. Thus, the cause of persistent equipment malfunctions may be rooted in a quite subtle power problem, e.g., harmonic distortion affecting a zero-cross voltage feature. Often, the only way many of these problems can be properly diagnosed is by displaying the line voltage on an oscilloscope. Unfortunately, many installations in which power conditioners are deployed are not equipped with oscilloscopes. Thus, the need has been felt for an oscilloscope that can be controlled via a portable terminal, such as a laptop computer, but with data acquisition circuitry incorporated into the power conditioner itself for diagnosing power related issues.

SUMMARY

A power monitor includes a power conditioning circuit that provides conditioned power to a load. The power conditioning circuit includes at least one sensor to measure a power quality characteristic, e.g., input voltage, load current, temperature, etc. A terminal device implements a diagnostic tool for the power monitor and includes a processor to obtain data indicative of the power quality characteristic over a communication link with the power monitor. The data may be retrieved in response to a trigger condition. A user interface implemented on the terminal device displays the obtained power quality characteristic as at least one temporally varying waveform.

DESCRIPTION OF EXAMPLE EMBODIMENTS

Figure 1:
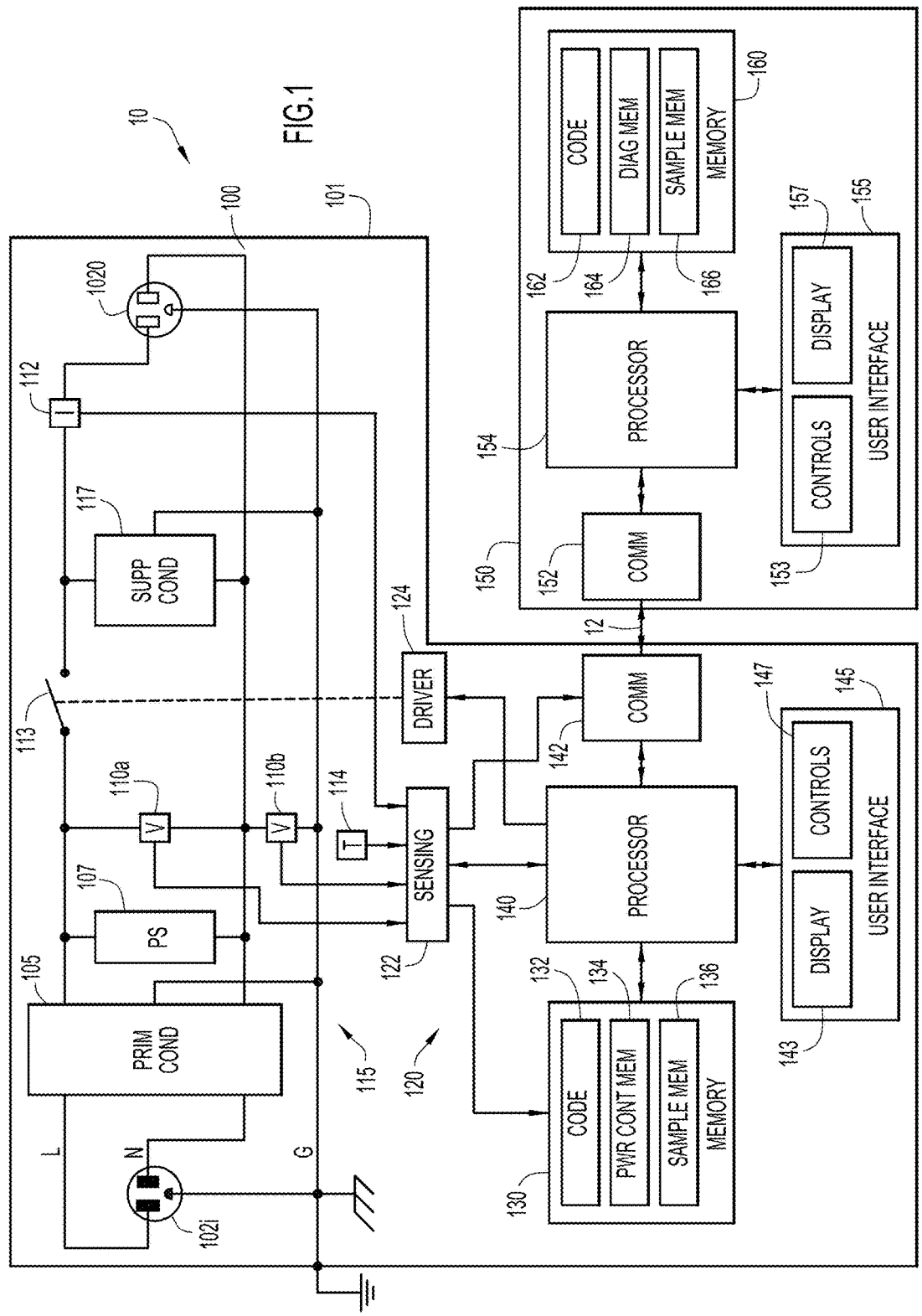
FIG. 1 is a schematic block diagram of a power conditioning diagnostic system by which the present general inventive concept can be embodied.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments The figures described herein include schematic block diagrams illustrating various interoperating functional modules. Such diagrams are not intended to serve as electrical schematics and interconnections illustrated are intended to depict signal flow, various interoperations between functional components and/or processes and are not necessarily direct electrical connections between such components. Moreover, the functionality illustrated and described via separate components need not be distributed as shown, and the discrete blocks in the diagrams are not necessarily intended to depict discrete electrical components.

FIG. 1 is a schematic block diagram of a conditioned power diagnostic system 10 by which the present invention can be embodied. Exemplary power diagnostic system 10 includes a power monitor 100 by which alternating current (AC) power provided by a power source is conditioned and selectively provided to a load. Exemplary power diagnostic system 10 may also include a terminal device 150, such as a computer on which a diagnostic tool can be implemented. Power monitor 100 and terminal device 150 may be implemented in numerous different devices as will be recognized by artisans skilled in the power conditioning and computer arts and the scope of the present invention is intended to encompass all such variations.

Exemplary power monitor 100 comprises an input port 102i through which AC power is received from a power source, such as from a power grid, and an output port 102o through which conditioned AC power is selectively provided to a load connected thereto. The provision of AC power to output port 102o is dependent upon the conductive state of switch 113, as will be discussed below.

AC power from the AC power source may be conditioned by a primary conditioning circuit 105 and a supplementary conditioning circuit 117. Primary conditioning circuit 105 may include suppression circuits by which voltage transients are prevented from proceeding through the remaining circuitry of power conditioning circuit 115. Primary conditioning circuit 105 may also include filter circuits by which electromagnetic interference (EMI) and/or radio-frequency interference (RFI) are removed from the supply power. Supplementary conditioning circuit 117 may include circuits that supplement the filtering and suppression of primary conditioning circuit 105. For example, secondary conditioning circuit 117 may include filter circuits to additionally remove EMI/RFI noise and may include suppression circuits to limit voltages of voltage surges to a maximum value.

Power monitor 100 may include a power supply 107 to convert some of the conditioned AC power into a direct current (DC) voltage as operating power for DC circuits 120 (connections not illustrated to promote clarity in the figure). DC circuits 120 include subsystems of power monitor 100 that monitor the AC power for certain anomalies and, when such anomalies meet corresponding criteria, operate switch 113 into one of conducting and non-conducting states. Additionally, DC circuits 120 may include circuits by which data for diagnostics may be obtained, as described below.

Power conditioning circuit 115 may include several sensors by which operation of power monitor 100 is monitored. For example, power monitor 100 may include a voltage sensor 110*a* to measure the voltage between line (L) and neutral (N) conductors on the supply side of switch 113. An additional voltage sensor 110*b* may be incorporated to measure the voltage between the N conductor and a ground (G) conductor. Power monitor 100 may also include a current sensor 112 to measure the load current through the L conductor. In certain embodiments, current sensor 112 may measure the load current through the N conductor. Power monitor 100 may include additional sensors to monitor other system characteristics, such as temperature by temperature sensor 114. Each sensor generates an electrical signal that indicates the state of the system characteristic for which it is configured. The present invention is not limited to a particular set of sensors or to the construction of such sensors; the skilled artisan will recognize numerous sensor types that can be used in conjunction with the present invention without departing from the spirit and intended scope thereof.

Voltage sensors 110*a*-110*b*, representatively referred to herein as voltage sensor(s) 110, current sensor 112, temperature sensor 114, and other sensors may be coupled to sensing processor 122, which conditions the sensor signals for subsequent processing, as described in detail below. Processor 140 may analyze the sensor data produced by sensing processor 122 to assess, among other things, power quality with respect to power quality criteria. When the power quality does not meet acceptability criteria, processor 140 may provide a power control signal to switch driver 124, which, in turn, compels switch 113 into a conductive or non-conductive state. For example, in response to overvoltage or undervoltage conditions, referred to herein as overvoltage or undervoltage power quality events, switch 113 may be compelled into a non-conductive state and, when such overvoltage and undervoltage conditions have been corrected, processor 140 may generate a power control signal to compel switch 113 into a conductive state. Other criteria may be associated with other actions. For example, certain voltage or current levels may invoke a data recording operation without a change of state in switch 113.

Processor 140 may be communicatively coupled to a memory 130 in which may be stored processor instructions in code segment 132, power control parameters in power control segment 134 and data samples from sensing processor 122 in data samples segment 136. Power control parameters may include power event criteria according to which actions, e.g., switch operation, data logging, etc., are taken. Power control segment 134 may also be used to store power quality event logs containing time-stamped power quality event information. Power quality events include, but are not limited to, overvoltage, undervoltage, overcurrent, undercurrent, over-temperature events, each of which may be defined by establishing a voltage, current or temperature level at which the event is said to occur. The levels may be set by a user through configuration controls. Power monitor 100 may be configured and may operate in a manner described in U.S. patent application Ser. No. 13/198,137, filed on Aug. 4, 2011 and entitled, "Supply Voltage Monitor," the disclosure of which is incorporated herein by reference in its entirety. However, it is to be understood that the present invention is not limited to particular circuitry that provides power from a power source to a load.

Processor 140 may also be communicatively coupled to a user interface 145, which may be implemented on a panel disposed on an exterior surface of a housing, representatively illustrated by boundary 101. User interface 145 may include a display 143 on which to display system status, for example, and user controls 147 by which a user can perform certain power monitor operations. The present invention is not limited to a particular user interface configuration and may be implemented without such an interface on power monitor 100.

Processor 140 may be communicatively coupled to a communication interface 142 through which power monitor 100 communicates with external equipment, such as terminal 150. The present invention is not limited to a particular communication interface, which may be implemented in accordance with a serial communication protocol, such as RS-232 or Universal Serial Bus (USB), a parallel communication protocol, such as peripheral component interconnect (PCI) or a telecommunication network protocol, such as Ethernet. Terminal device 150 includes a similar communication interface 152, to which a processor 154 is coupled. Processor 154 may be communicatively coupled to memory 160 in which may be stored processor instructions in code segment 162, diagnostic parameters in diagnostic segment 164 and data samples from power monitor 100 in data samples segment 166. Diagnostic parameters may include various criteria according to which analyses can be conducted, as will be discussed below.

Terminal device 150 may include a user interface 155 communicatively coupled to processor 154. User interface may include a display 157, which may be a computer display, and user controls 153, which may be one or more human interface devices, e.g., a keyboard, a mouse, etc. Processor 154 may execute processor instructions stored in code segment 162 that form a graphical user interface (GUI) on user interface 155. However, it is to be understood that the present invention is not so limited.

Terminal device 150 may be configured, such as by processor instructions executing on processor 154, as a diagnostic device to diagnose power problems in power monitor 100. In certain embodiments, user interface 155 implements controls that form a diagnostic tool, such as an oscilloscope, with sufficient bandwidth to observe voltage and current waveforms at standard AC line frequencies. Such bandwidth may also span frequencies associated with common power anomalies that cause power-related problems in not only load equipment, but in circuitry within power monitor 100. To that end, sensing processor 122 may generate digital data which may be obtained from power monitor 100 through a communication link 12 between communication interfaces 142 and 152. The digital data may be processed by processor 154 and displayed on user interface 155 per user selected parameters, as described below.

Figure 2:
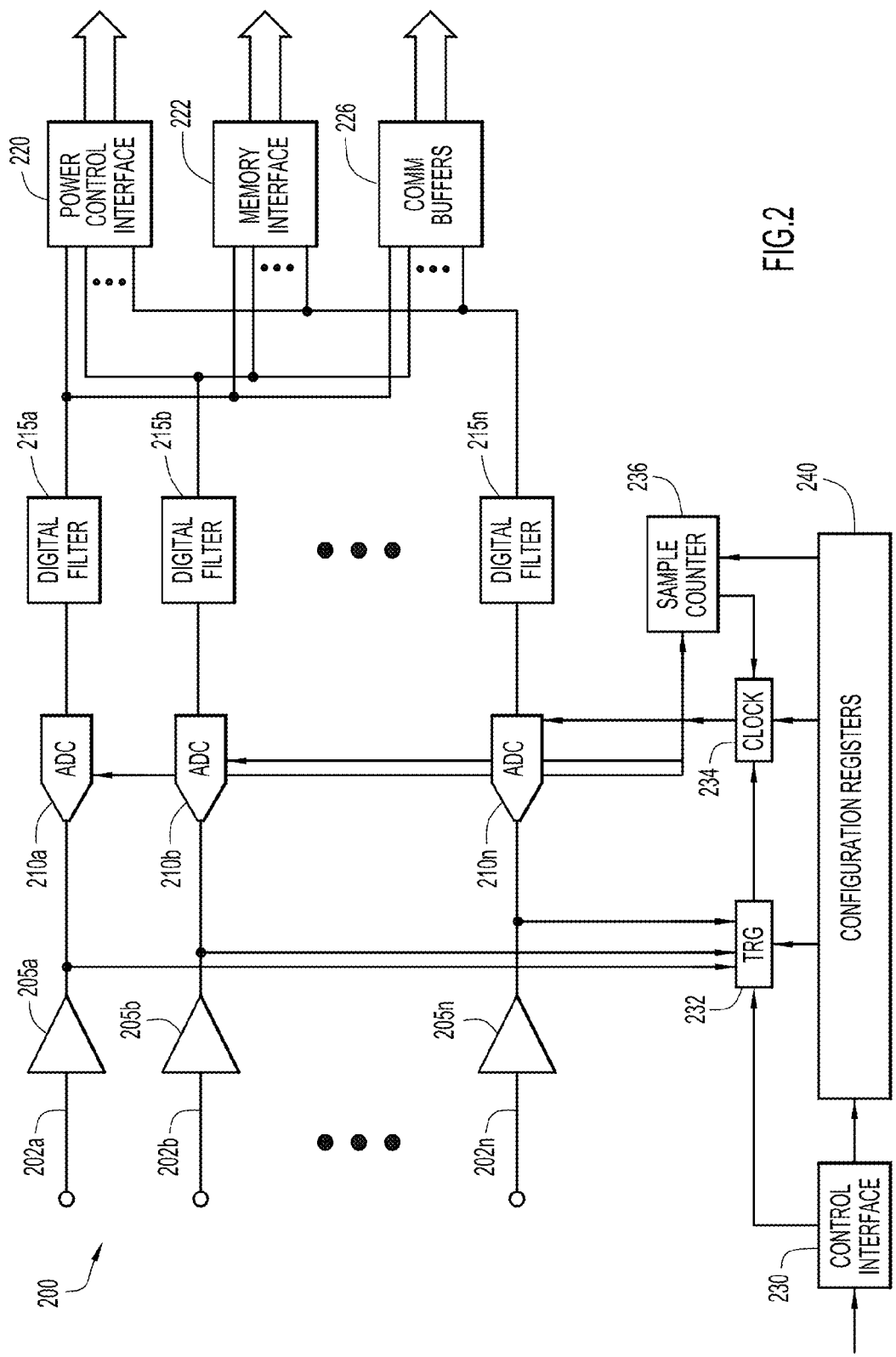
FIG. 2 is a schematic block diagram of functional circuits suitable for implementing oscilloscope functionality in embodiments of the present general inventive concept.

FIG. 2 is a schematic block diagram of an exemplary signal processing circuit 200 that can be incorporated in embodiments of the present invention. Signal processing circuit 200 may be realized as a combination of circuits in sensing processor 122, processor 140, processor 154 as well as processor instructions executing on processors 140 and 154. It is to be understood that the embodiment of signal processing circuit 200 is provided to explain possible operations by which a diagnostic tool may be realized in accordance with the present invention. Skilled artisans will recognize numerous other configurations that may realize similar functionality as that described in the paragraphs that follow. Indeed, embodiments of the present invention may be implemented using commercially available integrated circuits that are designed to carry out certain functions described herein.

Exemplary signal processing circuit 200 comprises a plurality of signal processing channels 202a-202n, representatively referred to herein as signal processing channel(s) 202. Each signal processing channel 202 may be coupled to a corresponding sensor, such as current sensor 112 and voltage sensors 110, and include a corresponding amplifier 205a-205n, representatively referred to herein as amplifier(s) 205, a corresponding analog-to-digital converter (ADC) 210a-210n, representatively referred to herein as ADC(s) 210, and a corresponding digital filter 215a-215n, representatively referred to herein as digital filter(s) 215. It is to be understood that signal processing channels 202 need not be configured identically; certain of amplifiers 205 may have variable gain capability, for example, and may be constructed to accept specific signal levels. ADCs 210 may be signal delta modulators producing low resolution data (e.g., 1 or 2 bits) at a high data rate and digital filters 215 may include rate change filtration to produce higher resolution data (e.g., 12-24 bit) at a lower data rate. High resolution digital data may be provided to a power control interface 220 through which data are delivered to a power control process executing on, for example, processor 140. The power control process controls the provision of power to connected loads, e.g., by operation of switch 113.

Digital data produced in signal processing channels 202 may also be provided to memory interface circuit 222 and to communication buffers 226. Memory interface circuit 222 may implement functionality by which samples of power characteristics, e.g., voltage, current, temperature, etc., are stored in data sample memory segment 136. Communication buffers 226 may provide storage of data samples for conveyance to terminal 150 over link 12.

Signal processing circuit 200 may include a control interface circuit 230 through which signal processing parameters may be provided thereto. Such parameters may be stored, such as in configuration registers 240, and accessed to control various functionality of signal processing circuit 200. For example, configuration registers 240 may include a register in which a sampling rate parameter may be stored to control sampling clock 234 and, thereby, the rate at which data samples are generated. A register may also be included in configuration registers 240 to indicate how many samples are to be collected in a data block. This number of samples may be accessed by sample counter 236. In certain embodiments, configuration registers 240 include one or more registers for storing trigger criteria for trigger control 232. In one embodiment, a signal in one or more signal processing channels 202 meeting a trigger level stored as a digital number in configuration registers 240 initiates a data collection cycle by which a data block, i.e. a number of samples in sample counter 236, is collected. The present invention may be embodied with a broad selection of user-selectable triggering levels and/or events so that power related problems from the simple to the complex can be diagnosed.

Figure 3:
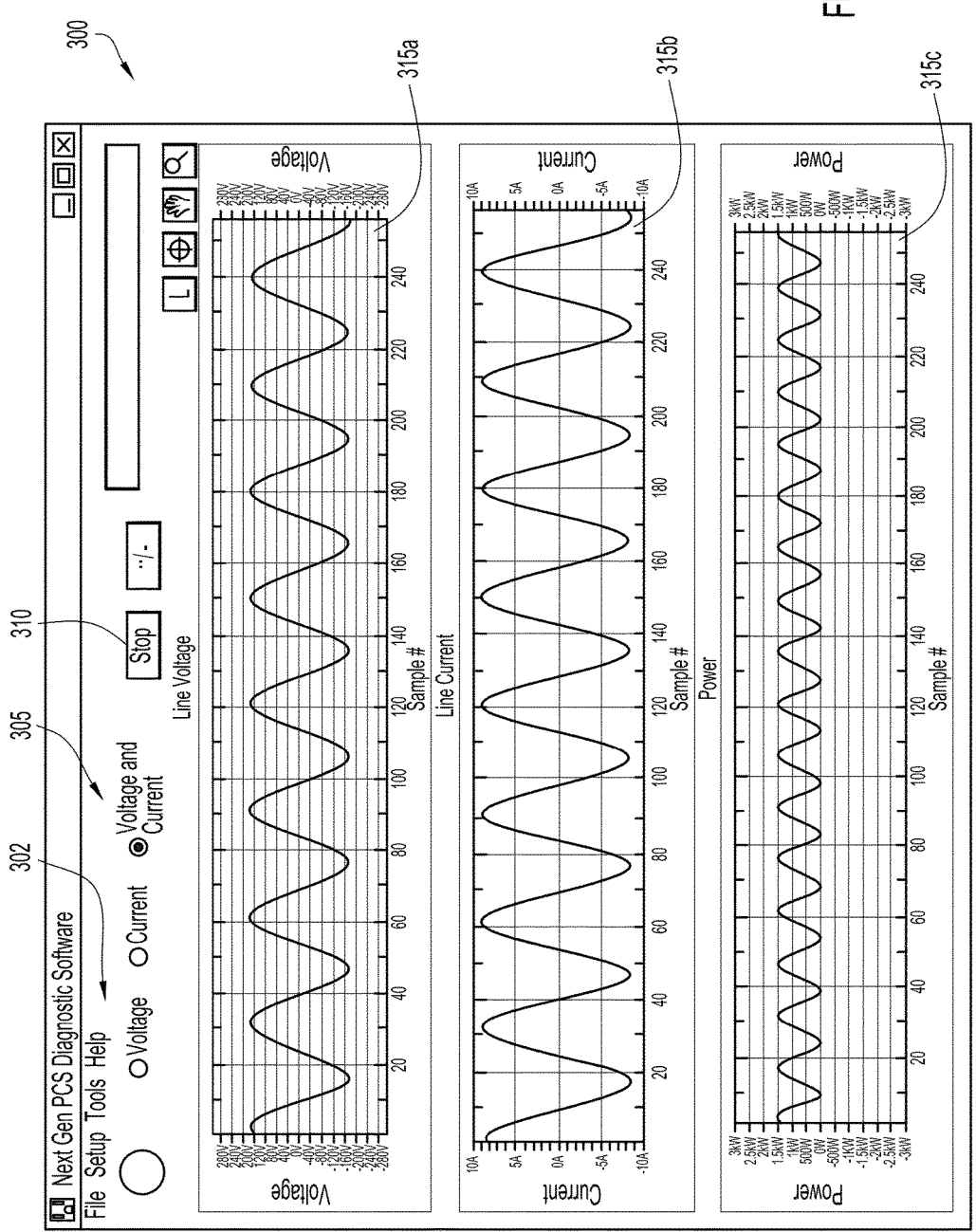
FIG. 3 is an illustration of an example diagnostic interface suitable for oscilloscope display and control in embodiments of the present general inventive concept.

FIG. 3 is an illustration of an example diagnostic interface 300 which can be used in conjunction with the present invention. As is illustrated, diagnostic interface presents AC supply voltage in panel 315a, load current in panel 315b and computed power in panel 315c, where the panels are representatively referred to herein as display panel(s) 315. The number of display panels 315 and the content in each panel is, in certain embodiments, a user selectable feature, such as through display selection control 305. Panels other than those illustrated may be implemented in embodiments of the invention, such as frequency spectra.

Embodiments of the present invention present the waveforms in an oscilloscope format, i.e., the waveforms are aligned based on a triggering event and are overlaid on a grid that is referenced to magnitude and temporal axes. Although not illustrated in FIG. 3, diagnostic interface 300 may include several controls that correspond to conventional oscilloscopes, such as to increase/decrease trigger level, change the time base, introduce timing delays, zoom on a particular region, etc. Those skilled in the diagnostic and programming arts will readily understand how such controls may be implemented for execution on processor 154 without implementation details. The present invention is not limited to a particular set of such controls.

Display panels 315 may be continuously updated depending on the mode of operation of the diagnostic tool. In certain embodiments, data are transferred from power monitor 100 to terminal 150 in data blocks, e.g., stored in communication buffers 226, and are displayed as retrieved. A user may halt such retrieval, thereby freezing the display panels 315 with the most recently retrieved data, by activating Stop control 310. When the user is ready to continue, the user may activate Stop control 310 once again, and data retrieval will resume.

Figure 4:
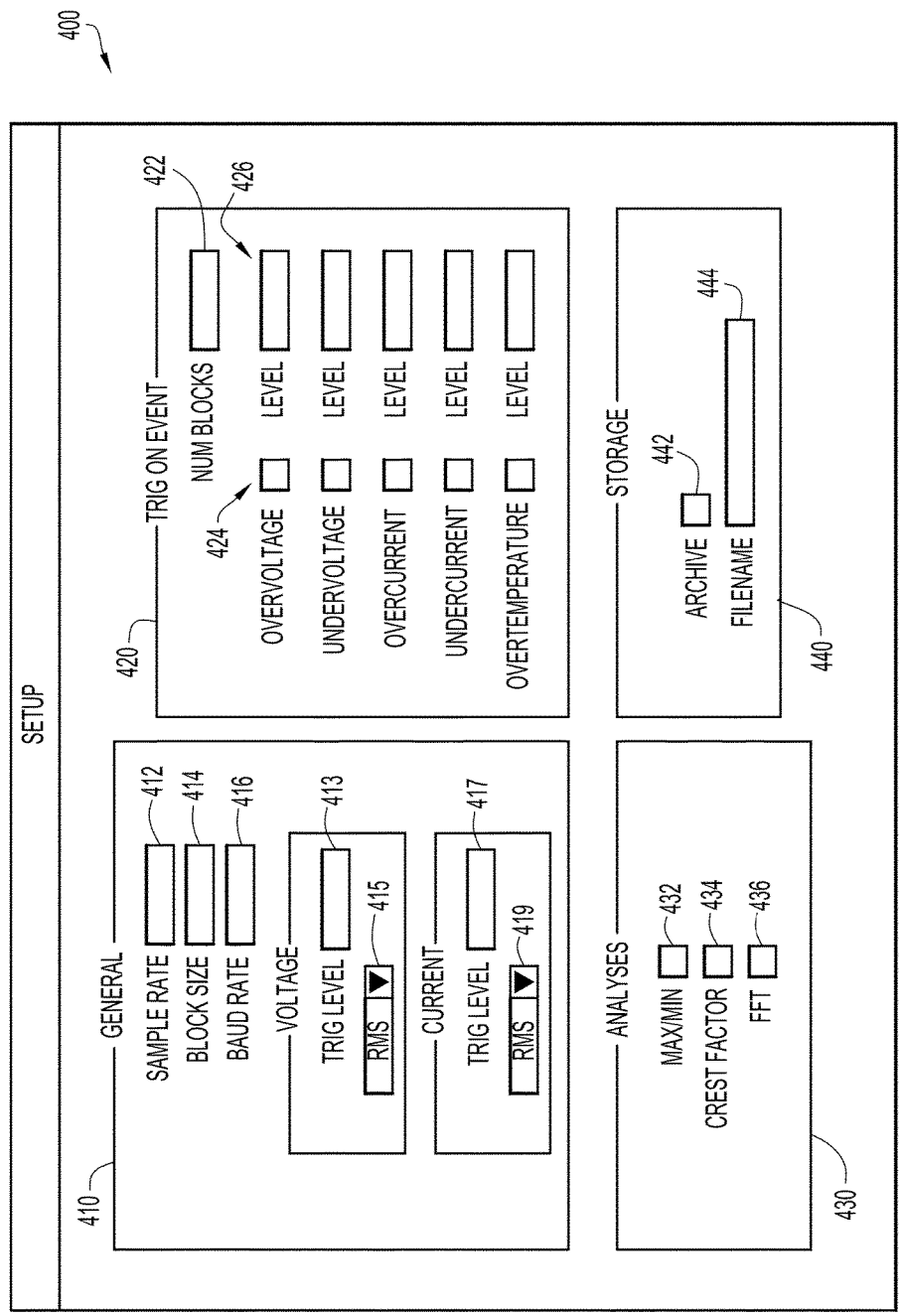
FIG. 4 is an illustration of an example setup interface for oscilloscope control in embodiments of the present general inventive concept.

The diagnostic tool described herein may be configured through various menus, which may be presented by activating controls on interface 300, such as controls 302. FIG. 4 is an illustration of an exemplary setup interface 400 by which processing parameters may be set and modified. It is to be understood that the controls illustrated in FIG. 4 do not comprise an exhaustive set; many other features may be implemented as those skilled in the diagnostic arts will recognize and appreciate. Implementation of such other features may be achieved in a manner similar to the examples given below.

In general control panel 410, a user may enter various configuration parameters. In control 412, sample rate may be entered, according with which sample clock 234 may be set. Block size control 414 allows the user to establish the size of a data block. In certain embodiments, the block size may be indicated as a number of samples or may be a number of cycles of the AC waveform. In a baud rate control 416, the user can establish the baud rate of data transfer over data link 12. Voltage trigger level entry control 413 and current level data entry control 415 allow entry of a trigger threshold level on line voltage or load current, respectively. Voltage format selection control 415 and current format selection control 419 allow selection of the manner in which voltage and current are displayed, e.g., peak-to-peak, root-mean-square (RMS), etc.

Trigger on Event panel 420 allows selection of one or more power quality events that can trigger data acquisition.

As illustrated, such power quality events include overvoltage events, undervoltage events, overcurrent events, undercurrent events and over-temperature events. Upon the occurrence of any of the events selected via selection controls 424, data samples may be collected and stored in data sample memory segment 136. The number of data blocks stored may be selected in data entry field 422. The level at which data collection occurs for each of the power quality events may be entered into a corresponding level data entry fields 426. In certain embodiments, the levels at which diagnostic data acquisition is triggered may be different than the levels at which power control decisions are made by processor 140 in power monitor 100.

Analyses panel 430 allows for the selection of various mathematical analysis tools. Max/min tool, selected by selection control 432, determines maximum and minimum sample values of voltage, current, temperature, etc. and indicates such to the user, such as on interface 300 at the point at which such maximum or minimum value occurs. Similarly, selection of selection control 434 causes the crest factor to be computed. Selection of selection control 436 causes a fast Fourier transform (FFT) to be computed and displayed on interface 300, such as in a separate pane for such.

Storage panel 440 allows control over whether data are stored in memory 160 during diagnostics. For example, when archive control 442 is activated and a filename is entered into filename data entry control 444, data retrieved from power monitor 100 is not only displayed for analysis, but is stored in an archive file. The archive file may be later retrieved from memory 160, e.g. from data sample memory segment 166 and played back via interface 300.

Figure 5A:
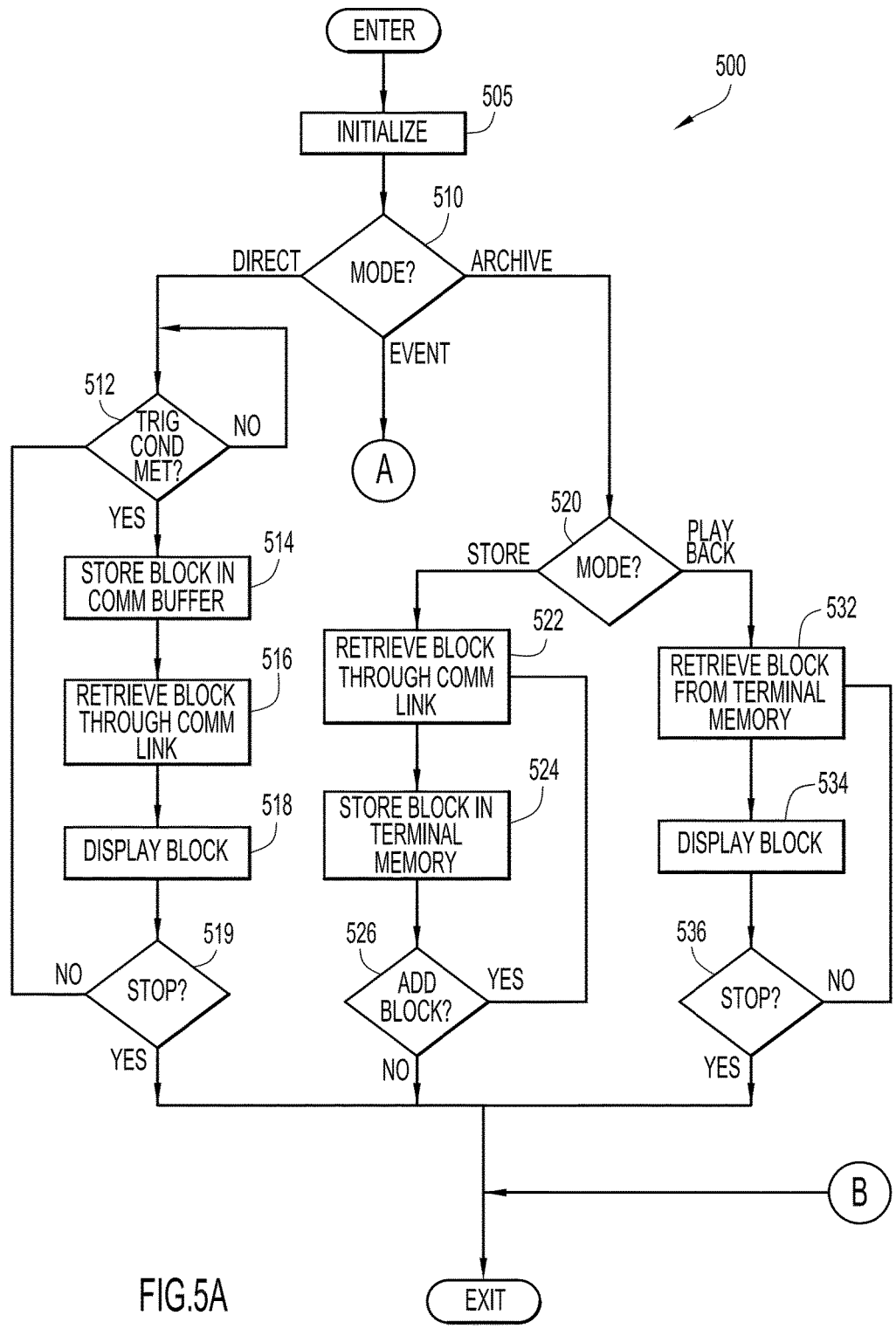
FIGS. 5A-5B is a flow diagram of a power conditioning diagnostic process by which the present general inventive concept can be embodied.
Figure 5B:
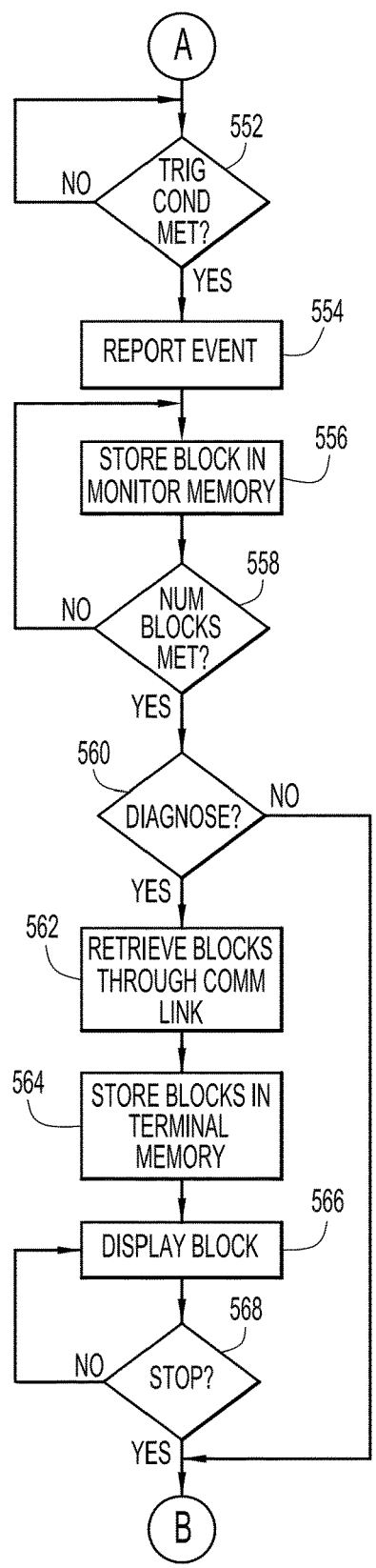

FIGS. 5A-5B are a flow diagram of an exemplary power conditioning diagnostic process 500 by which the present invention can be embodied. In operation 505, the diagnostic tools are initialized in accordance with setup parameters, such as those exemplified in FIG. 4. In operation 510, it is determined in what operation mode the diagnostics are to proceed. If the mode is the direct mode, process 500 transitions to operation 512, at which a trigger condition is awaited. When such occurs, diagnostic process 500 transitions to operation 514, at which samples are taken and stored in communication buffers 226. The data block stored in communication buffers 226 may then be retrieved by or otherwise transmitted to terminal device 150 in operation 516. Process 500 may then transition to operation 518 by which the data block is displayed on interface 300 in accordance with user-selected display parameters. In operation 519, it is determined whether the direct mode is to be stopped. Such may be achieved by activating Stop control 310, in response to which the current data set is frozen on interface 300 until the stop is released. Alternatively, a stop may be affirmed in operation 519 if the diagnostic tool is terminated. If, in operation 519, it is determined that no stop has been invoked, process 500 returns to operation 512 where a new data block is acquired and displayed.

If process 500 is to be operated in the archive mode, as determined in operation 510, the process transitions to operation 520, where it is determined whether the data are to be stored or played back. In the case where the data are to be stored, a data block is retrieved over communication link 12 in operation 522. In certain embodiments, archiving may be performed concurrently with the direct display mode, in which case the data retrieval of operation 522 may coincide with that of operation 516. In operation 524, the data block is stored in terminal memory 160, such as in an archive file. In operation 526, it is determined whether additional blocks are to be archived and, if so, process 500 returns to operation 522. If no additional block is to be added, the archive file is closed and the storage mode is terminated.

If, in operation 520, it is determined that data are to be played back, a data block is retrieved from terminal memory 160 in operation 532, such as from a previously created archive file. In operation 534, the retrieved data block is displayed in operation 534. In operation 536, it is determined whether the playback is to be terminated and, if so, the archive file may be closed and the playback mode terminated. If the playback mode is to continue, as determined in operation 536, process 500 returns to operation 532, where a new data block is retrieved.

The event triggered mode, as determined in operation 510, is illustrated in FIG. 5B. In operation 552, it is determined whether a trigger condition has been met, such as a power quality event. If such is the case, the event is reported in operation 554 and, in operation 556, a corresponding data block is stored in sample memory 136. In operation 558, it is determined whether the specified number of data blocks has been stored and, if not, process 500 returns to operation 556, where another data block is acquired and stored.

At some point in the future, such as when the user becomes aware of the power quality event e.g., from the report generated in operation 554, a diagnosis mode may be entered in operation 560. When such is the case, diagnosis process 500 transitions to operation 562 where the previously stored data is retrieved through data link 12 and stored in terminal memory in operation 564. In operation 566, a data block is displayed and blocks are continued to be displayed until a stop is invoked in operation 568.

Certain embodiments of the present general inventive concept provide for the functional components to be manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions may be encoded and then subsequently retrieved, decoded and executed by a processor, including electrical, magnetic and optical storage devices. Examples of non-transitory computer-readable recording media include, but are not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present general inventive concept as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An apparatus comprising:
   a power monitor comprising:
      a power conditioning circuit to provide conditioned electrical power to a load;
      a switch to provision the conditioned electrical power to the load via an output port;
      a plurality of sensors distributed in the power conditioning circuit to measure respective power quality characteristics therein;
      a communication buffer accessible by a terminal device via a communication link, wherein the communication buffer stores diagnostic data for conveyance to the terminal device over the communication link;
      a power monitor memory to store samples of the power quality characteristic measurements from the plurality of sensors;
      a processor, operable in a direct mode or an event mode, electrically coupled to the plurality of sensors to receive the power quality characteristic measurements therefrom, the signal processor being responsive to a trigger condition established by a user to store data blocks of the power quality characteristic measurements,
         wherein when the trigger condition established by the user is met in response to occurrence of a power quality event and the processor is in the direct mode, acquisition of diagnostic data is triggered and the diagnostic data is stored in the communication buffer,
         wherein when the trigger condition established by the user is met in response to occurrence of a power quality event and the processor is in the event mode, acquisition of diagnostic data is triggered and the diagnostic data is stored in the power monitor memory, and detection of the trigger condition is reported;
         wherein the power quality event is defined by the power quality characteristic measurements meeting a power anomaly criterion;
         wherein the processor generates a signal to control the switch into a non-conducting state to interrupt provision of the conditioned electrical power to the load when detecting the power quality event; and
   a terminal device comprising:
      a processor, operable in an archive mode, to obtain the data blocks from the communication buffer of the power monitor over the communication link therewith; and
      a user interface by which the user defines the trigger condition and on which the obtained data blocks are displayed, the data blocks comprising at least one temporally-dependent waveform comprising the power anomaly, wherein the power anomaly comprises a harmonic distortion.

2. The apparatus of claim 1, further comprising:
   a processor in the power monitor to determine whether the trigger condition is met from a comparison of a user selected one of either alternating current (AC) voltage between conductors of the power conditioning circuit as measured by at least one of the sensors with a voltage trigger level or AC load current in the line or neutral conductor of the power conditioning circuit as measured by at least one of the sensors with a current trigger level.

3. The apparatus of claim 2, wherein the processor in the terminal device generates user controls on the user interface by which to establish, as the trigger condition, a single shot trigger level, a rising or falling edge trigger on a specified waveform or a specified threshold of a specified waveform.

4. The apparatus of claim 1, wherein the processor in the terminal device generates user controls on the user interface by which at least one power quality event is selected as the trigger condition.

5. The apparatus of claim 4, wherein
   the processor generates a power control signal responsive to the power quality event that is selected as the trigger condition; and
   wherein the switch in the power conditioning circuit interrupts provision of the conditioned electrical power to the load in response to the power control signal.

6. The apparatus of claim 5, wherein at least one of the sensors is electrically coupled to the power monitor at a supply-side of the switch and at least one of the sensors is coupled to the power monitor at a load-side of the switch.

7. The apparatus of claim 1, further comprising:
   a user control on the user interface of the terminal device by which more than one of the power quality characteristic measurements are selected for display, wherein the user interface simultaneously displays the data blocks of the selected power quality characteristic measurements as corresponding temporally-dependent waveforms that are aligned on a time at which the trigger condition is met.

8. The apparatus of claim 7, further comprising:
   a stop control on the user interface of the terminal device by which, in response to user-activation of the stop control, the transmission of the data blocks from the communication buffer is halted until a subsequent user-activation of the stop control.

9. The method of claim 1, wherein the processor determines that the trigger condition is met for a power quality event, and sends a notification to a user regarding detection of the power anomaly.

10. A method comprising:
   establishing a communication link between a power monitor and a terminal device;
   defining, through a user interface of the terminal device, a trigger condition on power quality characteristic measurements made by a plurality of sensors distributed in a power conditioning circuit of the power monitor,
      wherein when the trigger condition established by the user is met in response to occurrence of a power quality event, as determined by a sensor that measures a power quality characteristic, and the processor is in a direct mode, acquisition of diagnostic data is triggered and the diagnostic data is stored in a communication buffer of the power monitor, and
      wherein when the trigger condition established by the user is met in response to occurrence of a power quality event, as determined by a sensor that measures a power quality characteristic, and the processor is in an event mode, acquisition of diagnostic data is triggered and the diagnostic data is stored in power monitor memory, and detection of the trigger condition is reported;

wherein the power quality event is defined by the power quality characteristic measurements meeting a power anomaly criterion; and obtaining data from the communication buffer of the power monitor through the communication link, wherein the communication buffer stores diagnostic data for conveyance to a terminal device over the communication link; and displaying the obtained data blocks on the user interface as at least one temporally-dependent waveform comprising the power anomaly, wherein the power anomaly comprises a harmonic distortion, and generating a signal to control a switch into a non-conducting state to interrupt provision of conditioned electrical power to a load when detecting the power quality event.

11. The method of claim 10, further comprising determining whether the trigger condition is met from a comparison of a user selected one of either alternating current (AC) voltage between conductors of the power conditioning circuit as measured by at least one of the sensors with a voltage trigger level or AC load current in the line or neutral conductor of the power conditioning circuit as measured by at least one of the sensors with a current trigger level.

12. The method of claim 11, further comprising generating user controls on the user interface by which to establish, as the trigger condition, a single shot trigger level, a rising or falling edge trigger on a specified waveform or a specified threshold of a specified waveform.

13. The method of claim 10, further comprising generating a user control on the user interface by which at least one power quality event is selected as the trigger condition.

14. The method of claim 10, further comprising:

selecting, through a user control on the user interface in the terminal device, more than one of the power quality characteristic measurements for display; and displaying simultaneously on the user interface, the data blocks of the selected power quality characteristic measurements as corresponding temporally-dependent waveforms that are aligned on a time at which the trigger condition is met.

15. A tangible, non-transient computer readable medium having encoded thereon processor instructions, that when executed by a processor configures the processor to:

establish, through a user interface of a terminal device, a trigger condition on power quality characteristic measurements, wherein when the trigger condition established by the user is met in response to occurrence of a power quality event, as determined by a sensor that measures a power quality characteristic, and the processor is in a direct mode, acquisition of diagnostic data is triggered and the diagnostic data is stored in a communication buffer of the power monitor, and wherein when the trigger condition established by the user is met in response to occurrence of a power quality event, as determined by a sensor that measures a power quality characteristic, and the processor is in an event mode, acquisition of diagnostic data is triggered and the diagnostic data is stored in power monitor memory, and detection of the trigger condition is reported;

wherein the power quality event is defined by the power quality characteristic measurements meeting a power anomaly criterion; and obtain, through a communication link, a data block of a user-selected one of the power quality characteristic measurements generated by a corresponding one of a plurality of sensors distributed in a power conditioning circuit of a power monitor, wherein a communication buffer stores diagnostic data for conveyance to a terminal device over the communication link; and generate a user interface by which a user establishes the trigger condition and on which the obtained data block is displayed as at least one temporally-dependent waveform comprising a power anomaly, wherein the power anomaly comprises a harmonic distortion; and generate a signal to control a switch into a non-conducting state to interrupt provision of conditioned electrical power to a load when detecting the power quality event.

16. The computer readable medium of claim 15, further comprising processor instructions, that when executed by the processor, further configures the processor to:

determine whether the trigger condition is met from a comparison of a user selected one of either alternating current (AC) voltage between conductors of the power conditioning circuit as measured by at least one of the sensors with a voltage trigger level or AC load current in the line or neutral conductor of the power conditioning circuit as measured by at least one of the sensors with a current trigger level.

17. The computer readable medium of claim 15, further comprising processor instructions, that when executed by the processor, further configures the processor to:

generate user controls on the user interface by which to establish, as the trigger condition, a single shot trigger level, a rising or falling edge trigger on a specified waveform, a specified threshold of a specified waveform and by which to specify the memory location of the data blocks.

18. The computer readable medium of claim 15, further comprising processor instructions, that when executed by the processor, further configures the processor to:

generate a user control on the user interface by which at least one power quality event is selected as the trigger condition.

* * * * *